(12) United States Patent
Zheng et al.

(10) Patent No.: US 11,574,597 B2
(45) Date of Patent: Feb. 7, 2023

(54) GATE DRIVING UNIT HAVING NODE ISOLATION

(71) Applicant: BOE TECHNOLOGY GROUP CO., LTD., Beijing (CN)

(72) Inventors: Can Zheng, Beijing (CN); Yu Feng, Beijing (CN); Guangliang Shang, Beijing (CN); Libin Liu, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/426,949

(22) PCT Filed: Oct. 27, 2020

(86) PCT No.: PCT/CN2020/123954
§ 371 (c)(1),
(2) Date: Jul. 29, 2021

(87) PCT Pub. No.: WO2022/087817
PCT Pub. Date: May 5, 2022

(65) Prior Publication Data
US 2022/0148512 A1 May 12, 2022

(51) Int. Cl.
*G09G 3/3266* (2016.01)
*G09G 3/20* (2006.01)

(52) U.S. Cl.
CPC ... *G09G 3/3266* (2013.01); *G09G 2300/0426* (2013.01); *G09G 2300/0842* (2013.01); *G09G 2310/08* (2013.01); *G09G 2320/0214* (2013.01)

(58) Field of Classification Search
CPC ............... G09G 2310/0286; G09G 2310/0267
See application file for complete search history.

(56) References Cited

U.S. PATENT DOCUMENTS

| | | | | |
|---|---|---|---|---|
| 8,284,150 B2 * | 10/2012 | Han | ...................... | G11C 19/184 377/64 |
| 2008/0266275 A1 * | 10/2008 | Tsai | ...................... | G09G 3/3677 345/204 |

(Continued)

FOREIGN PATENT DOCUMENTS

| CN | 103489423 A | 1/2014 |
|---|---|---|
| CN | 203644373 U | 6/2014 |

(Continued)

*Primary Examiner* — Sepehr Azari
(74) *Attorney, Agent, or Firm* — Muncy, Geissler, Olds & Lowe, P.C.

(57) ABSTRACT

A gate driving unit, a gate driving circuit, a gate driving method, and a display device are provided. The gate driving unit includes a first output circuit and a second output circuit; the second output circuit comprises a first output sub-circuit; the first output circuit is respectively electrically connected to the first node, the second node and the first gate driving signal output end and is configured to control the first gate driving signal output end to output a first gate driving signal under the control of the potential of the first node and the potential of the second node; the first output sub-circuit is respectively electrically connected to the first node, the second gate driving signal output end and the first clock signal end, and is configured to control the second gate driving signal output end to be connected to the first clock signal end.

18 Claims, 6 Drawing Sheets

(56) References Cited

U.S. PATENT DOCUMENTS

| | | | |
|---|---|---|---|
| 2012/0139962 A1 | 6/2012 | Chung et al. | |
| 2013/0002306 A1 | 1/2013 | Chung | |
| 2016/0125955 A1 | 5/2016 | Pang | |
| 2017/0140698 A1 | 5/2017 | Hwang et al. | |
| 2017/0194162 A1 | 7/2017 | Liu et al. | |
| 2018/0130435 A1 | 5/2018 | Lee et al. | |
| 2018/0174503 A1* | 6/2018 | Shim | G11C 19/28 |
| 2018/0182300 A1* | 6/2018 | Chen | G09G 3/3674 |
| 2019/0130857 A1 | 5/2019 | Ma | |
| 2020/0265877 A1* | 8/2020 | Zheng | G09G 3/20 |
| 2021/0090484 A1* | 3/2021 | Shang | G09G 3/20 |
| 2021/0097938 A1 | 4/2021 | Wu | |
| 2021/0335202 A1* | 10/2021 | Feng | G11C 19/28 |

FOREIGN PATENT DOCUMENTS

| | | |
|---|---|---|
| CN | 104299590 A | 1/2015 |
| CN | 205282054 U | 6/2016 |
| CN | 106057119 A | 10/2016 |
| CN | 106782284 A | 5/2017 |
| CN | 106971962 A | 7/2017 |
| CN | 107134246 A | 9/2017 |
| CN | 108257550 A | 7/2018 |
| CN | 111179813 A | 5/2020 |
| KR | 20190021985 A | 3/2019 |

\* cited by examiner

GATE DRIVING UNIT HAVING NODE ISOLATION

CROSS REFERENCE OF RELATED APPLICATION

The present application is the U.S. national phase of PCT Application PCT/CN2020/123954 filed on Oct. 27, 2020, which is incorporated herein by reference in its entirety.

TECHNICAL FIELD

The present disclosure relates to the field of display technologies, and in particular, to a gate driving unit, a gate driving circuit, a gate driving method, and a display device.

BACKGROUND

With the increasing demand of people for display, high and low frequency display becomes a hotspot for research, and an oxide TFT (thin film transistor) can realize low frequency due to its low leakage current, and is compatible with LTPS (low temperature polysilicon) process, so that it is used in an OLED (organic light emitting diode) pixel circuit. Since the Oxide TFT is an n-type transistor, a gate driving circuit for providing a control signal thereto becomes one of key technologies of LTPO (Low Temperature Polycrystalline Oxide) technology.

SUMMARY

In one aspect, the present disclosure provides a gate driving unit, including a first output circuit and a second output circuit; where the second output circuit includes a first output sub-circuit;

the first output circuit is respectively electrically connected to a first node, a second node and a first gate driving signal output end, and is configured to control the first gate driving signal output end to output a first gate driving signal under a control of a potential of the first node and a potential of the second node;

the first output sub-circuit is respectively electrically connected to the first node, a second gate driving signal output end and a first clock signal end, and is configured to control the second gate driving signal output end to be connected to the first clock signal end under the control of the potential of the first node.

Optionally, the first output sub-circuit includes a first output transistor;

a control electrode of the first output transistor is electrically connected to the first node, a first electrode of the first output transistor is electrically connected to the first clock signal end, and a second electrode of the first output transistor is electrically connected to the second gate driving signal output end.

Optionally, the second output circuit further includes a second output sub-circuit and a third node control sub-circuit;

the second output sub-circuit is respectively electrically connected to a third node, the second gate driving signal output end and a first voltage end, and is configured to control a writing of a first voltage signal provided by the first voltage end into the second gate driving signal output end under a control of a potential of the third node;

the third node control sub-circuit is respectively electrically connected to the first gate driving signal output end, a second clock signal end, a third clock signal end, the first voltage end and a second voltage end, and is configured to control the potential of the third node under the control of the first gate driving signal output by the first gate driving signal output end, the second clock signal provided by the second clock signal end and the third clock signal provided by the third clock signal end.

Optionally, the second output sub-circuit includes a second output transistor;

a control electrode of the second output transistor is electrically connected to the third node, a first electrode of the second output transistor is electrically connected to the second gate driving signal output end, and a second electrode of the second output transistor is electrically connected to the first voltage end.

Optionally, the third node control sub-circuit is further configured to control a writing of a second voltage signal provided by the second voltage end into the third node under the control of the first gate driving signal, to control a writing of the first voltage signal into the third node under a control of the second clock signal, and to control a potential of the third node according to the third clock signal.

Optionally, the third node control sub-circuit includes a first control transistor, a second control transistor, and a first control capacitor, where a control electrode of the first control transistor is electrically connected to the first gate driving signal output end, a first electrode of the first control transistor is electrically connected to the second voltage end, and a second electrode of the first control transistor is electrically connected to the third node;

a control electrode of the second control transistor is electrically connected to the second clock signal end, a first electrode of the second control transistor is electrically connected to the third node, and a second electrode of the second control transistor is electrically connected to the first voltage end; and a first end of the first control capacitor is electrically connected to the third node, and a second end of the first control capacitor is electrically connected to the third clock signal end.

Optionally, the third node control sub-circuit includes a third isolation node control unit circuit and a third node control unit circuit, where the third isolation node control unit circuit is electrically connected to the first gate driving signal output end, the second voltage end, a third isolation node, the second clock signal end, the third clock signal end and the first voltage end, respectively, and is configured to control a writing of a second voltage signal into the third isolation node under a control of the first gate driving signal, control a writing of the first voltage signal into the third isolation node under a control of the second clock signal, and control a potential of the third isolation node according to the third clock signal;

the third node control unit circuit is electrically connected to the first gate driving signal output end, the third isolation node, the second voltage end, and the third node, respectively, and is configured to write a second voltage signal into the third node under the control of the first gate driving signal, and is configured to control the third node and the third isolation node to be connected to each other under a control of a potential of the third isolation node, and is configured to maintain the potential of the third node.

Optionally, the third isolation node control unit circuit includes a first control transistor, a second control transistor, and a first control capacitor, where a control electrode of the first control transistor is electrically connected to the first gate driving signal output end, a first electrode of the first control transistor is electrically connected to the second voltage end, and a second electrode of the first control transistor is electrically connected to the third isolation node;

a control electrode of the second control transistor is electrically connected to the second clock signal end, a first electrode of the second control transistor is electrically connected to the third isolation node, and a second electrode of the second control transistor is electrically connected to the first voltage end; and a first end of the first control capacitor is electrically connected to the third isolation node, and a second end of the first control capacitor is electrically connected to the third clock signal end.

Optionally, the third node control unit circuit includes a third control transistor, a fourth control transistor, and a first storage capacitor, where a control electrode of the third control transistor is electrically connected to the first gate driving signal end, a first electrode of the third control transistor is electrically connected to the second voltage end, and a second electrode of the third control transistor is electrically connected to the third node;

a control electrode of the fourth control transistor and a first electrode of the fourth control transistor are bo$^{th}$ electrically connected to the third isolation node, and a second electrode of the fourth control transistor is electrically connected to the third node; and a first end of the first storage capacitor is electrically connected to the third node, and a second end of the first storage capacitor is electrically connected to the first voltage end.

Optionally, the first output circuit includes a first node control sub-circuit and a tank sub-circuit;

the first node control sub-circuit is respectively electrically connected to a third clock signal end, an input end, a second voltage end, a second node and a first node, and is configured to write an input signal provided by the input end into the first node under a control of a third clock signal provided by the third clock signal end and write a second voltage signal provided by the second voltage end into the first node under the control of the potential of the second node;

the first end of the tank sub-circuit is electrically connected to the first node, the second end of the tank sub-circuit is electrically connected to the first gate driving signal output end, and the tank sub-circuit is configured to store electric energy.

Optionally, the first node control sub-circuit includes a fifth control transistor and a sixth control transistor, where a control electrode of the fifth control transistor is electrically connected to the third clock signal end, a first electrode of the fifth control transistor is electrically connected to the input end, and a second electrode of the fifth control transistor is electrically connected to the first node;

a control electrode of the sixth control transistor is electrically connected to the second node, a first electrode of the sixth control transistor is electrically connected to the second voltage end, and a second electrode of the sixth control transistor is electrically connected to the first node;

the tank sub-circuit includes a second storage capacitor;

a first end of the second storage capacitor is electrically connected to the first node, and a second end of the second storage capacitor is electrically connected to the first gate driving signal output end.

Optionally, the first node control sub-circuit includes a first control unit circuit, a second control unit circuit, a third control unit circuit, a fourth control unit circuit, a fifth control unit circuit, and a sixth control unit circuit, where the first control unit circuit is respectively electrically connected to a third clock signal end, the input end and a fourth node and is configured to write the input signal into the fourth node under the control of the third clock signal;

the second control unit circuit is electrically connected to the third clock signal end, the fourth node and the first node respectively, and is configured to control a communication between the fourth node and the first node under the control of the third clock signal;

the third control unit circuit is electrically connected to the first gate driving signal output end, the fourth clock signal end and the fourth node, and is configured to write a fourth clock signal provided by the fourth clock signal end into the fourth node under the control of the first gate driving signal provided by the first gate driving signal output end;

the fourth control unit circuit is respectively electrically connected to the second node, the second voltage end and the fifth node, and is configured to write a second voltage signal provided by the second voltage end into the fifth node under the control of the potential of the second node;

the fifth control unit circuit is respectively electrically connected to the second node, the fifth node and the first node and is configured to control a communication between the fifth node and the first node under the control of the potential of the second node;

the sixth control unit circuit is electrically connected to the first node, the fifth node, and the first voltage end, respectively, and configured to write a first voltage signal provided by the first voltage end into the fifth node under the control of the potential of the first node.

Optionally, the first control unit circuit includes a fifth control transistor, the second control unit circuit includes a seventh control transistor, the third control unit circuit includes an eighth control transistor, the fourth control unit circuit includes a sixth control transistor, the fifth control unit circuit includes a ninth control transistor, the sixth control unit circuit includes a tenth control transistor, where a control electrode of the fifth control transistor is electrically connected to the third clock signal end, a first electrode of the fifth control transistor is electrically connected to the input end, and a second electrode of the fifth control transistor is electrically connected to the fourth node;

a control electrode of the seventh control transistor is electrically connected to the third clock signal end, a first electrode of the seventh control transistor is electrically connected to the fourth node, and a second electrode of the seventh control transistor is electrically connected to the first node;

a control electrode of the eighth control transistor is electrically connected to the first gate driving signal output end, a first electrode of the eighth control transistor is electrically connected to a fourth clock signal end, and a second electrode of the eighth control transistor is electrically connected to the fourth node;

a control electrode of the sixth control transistor is electrically connected to the second node, a first electrode of the sixth control transistor is electrically connected to the second voltage end, and a second electrode of the sixth control transistor is electrically connected to the fifth node;

a control electrode of the ninth control transistor is electrically connected to the second node, a first electrode of the ninth control transistor is electrically connected to the fifth node, and a second electrode of the ninth control transistor is electrically connected to the first node;

a control electrode of the tenth control transistor is electrically connected to the first node, a first electrode of the tenth control transistor is electrically connected to the fifth node, and a second electrode of the tenth control transistor is electrically connected to the first voltage end.

Optionally, the first output circuit further includes a second node control sub-circuit and a third output sub-circuit;

the second node control sub-circuit is respectively electrically connected to a second node, the input end, a second clock signal end, a first voltage end and a second voltage end, and is configured to write a second voltage signal provided by the second voltage end into the second node under the control of the input signal, write a first voltage signal provided by the first voltage end into the second node under the control of a second clock signal provided by the second clock signal end, and maintain the potential of the second node;

the third output sub-circuit is respectively electrically connected to the second node, the second voltage end, the first gate driving signal output end, the first node and a fourth clock signal end, and is configured to write a fourth clock signal provided by the fourth clock signal end into the first gate driving signal output end under the control of the potential of the first node, and write a second voltage signal into the first gate driving signal output end under the control of the potential of the second node.

Optionally, the second node control sub-circuit includes a seventh control transistor, an eighth control transistor, and a second control capacitance;

a control electrode of the seventh control transistor is electrically connected to a second clock signal end, a first electrode of the seventh control transistor is electrically connected to a second node, and a second electrode of the seventh control transistor is electrically connected to the first voltage end;

a control electrode of the eighth control transistor is electrically connected to the input end, a first electrode of the eighth control transistor is electrically connected to the second voltage end, and a second electrode of the eighth control transistor is electrically connected to the second node; and the first end of the second control capacitor is electrically connected to the second node, and the second end of the second control capacitor is electrically connected to the second voltage end.

Optionally, the third output sub-circuit includes a third output transistor and a fourth output transistor, where a control electrode of the third output transistor is electrically connected to the second node, a first electrode of the third output transistor is electrically connected to the second voltage end, and a second electrode of the third output transistor is electrically connected to the first gate driving signal output end;

a control electrode of the fourth output transistor is electrically connected to the first node, a first electrode of the fourth output transistor is electrically connected to the first gate driving signal output end, and a second electrode of the fourth output transistor is electrically connected to the fourth clock signal end.

In a second aspect, a gate driving circuit including the gate driving unit hereinabove is further provided in the embodiments of the present disclosure.

Optionally, the gate driving circuit further includes a first clock signal input end, a second clock signal input end, a third clock signal input end, a first clock signal end, a second first clock signal end, and a third first clock signal end;

the input end of the gate driving unit is electrically connected to the first gate driving signal output end of the adjacent upper-level gate driving unit;

a third clock signal end of a $(3n-2)^{th}$ level gate driving unit is electrically connected to the first clock signal input end, a fourth clock signal end of the $(3n-2)^{th}$ level gate driving unit is electrically connected to the second clock signal input end, and a second clock signal end of the $(3n-2)^{th}$ level gate driving unit is electrically connected to the third clock signal input end; the first clock signal end of the $(3n-2)^{th}$ gate driving unit is electrically connected to the second first clock signal end;

a third clock signal end of the $(3n-1)^{th}$ level gate driving unit is electrically connected to a second clock signal input end, a fourth clock signal end of the $(3n-1)^{th}$ level gate driving unit is electrically connected to a third clock signal input end, and a second clock signal end of the $(3n-1)^{th}$ level gate driving unit is electrically connected to a first clock signal input end; the first clock signal end of the $(3n-1)^{th}$ gate driving unit is electrically connected to the third first clock signal end;

a third clock signal end of the $3n^{th}$ level gate driving unit is electrically connected to a third clock signal input end, a fourth clock signal end of the $3n^{th}$ level gate driving unit is electrically connected to the first clock signal input end, and a second clock signal end of the $3n^{th}$ level gate driving unit is electrically connected to the second clock signal input end; the first clock signal end of the $3n^{th}$ gate driving unit is electrically connected to the first clock signal end;

n is a positive integer.

In a third aspect, a gate driving method applied to the gate driving circuit hereinabove is further provided in the embodiment of the present disclosure, including:

the first output circuit controlling the first gate driving signal output end to output a first gate driving signal under the control of the potential of the first node and the potential of the second node;

the first output sub-circuit controlling a communication between the second gate driving signal output end and the first clock signal end under the control of the potential of the first node.

In a fourth aspect, a display device including the gate driving circuit hereinabove is further provided in the embodiment of the present disclosure.

DETAILED DESCRIPTION

The technical solutions in the embodiments of the present disclosure will be described clearly and completely with reference to the drawings in the embodiments of the present disclosure, and it is obvious that the embodiments described are only some embodiments of the present disclosure, rather than all embodiments. All other embodiments, which can be derived by a person skilled in the art from the embodiments disclosed herein without making any creative effort, shall fall within the protection scope of the present disclosure.

The transistors used in all embodiments of the present disclosure may be transistors, thin film transistors, or field effect transistors or other devices with the same characteristics. In the embodiments of the present disclosure, to distinguish two electrodes of a transistor except for a control electrode, one electrode is referred to as a first electrode, and the other electrode is referred to as a second electrode.

In practical operation, when the transistor is a triode, the control electrode may be a base electrode, the first electrode may be a collector electrode, and the second electrode may be an emitter electrode; alternatively, the control electrode may be a base electrode, the first electrode may be an emitter electrode, and the second electrode may be a collector electrode.

In practical operation, when the transistor is a thin film transistor or a field effect transistor, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

Figure 1:
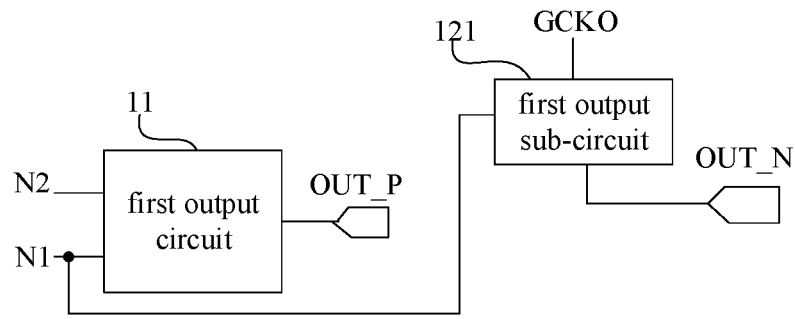
FIG. 1 is a structural diagram of a gate driving unit according to at least one embodiment of the disclosure.

As shown in FIG. 1, the gate driving unit according to at least one embodiment of the present disclosure includes a first output circuit 11 and a second output circuit; the second output circuit includes a first output sub-circuit 121;

the first output circuit 11 is electrically connected to the first node N1, the second node N2 and the first gate driving signal output end OUT_P, respectively, and is configured to control the first gate driving signal output end OUT_P to output a first gate driving signal under the control of the potential of the first node N1 and the potential of the second node N2;

the first output sub-circuit 121 is electrically connected to the first node N1, the second gate driving signal output end OUT_N and the first clock signal end, respectively, and is configured to control the second gate driving signal output end OUT_N and the first clock signal end to be connected to each other under the control of the potential of the first node N1;

the first clock signal end is used for providing a first clock signal GCKO.

The gate driving unit according to at least one embodiment of the present disclosure may provide a first gate driving signal and a second gate driving signal, where the first gate driving signal is used to control a p-type transistor, and the second gate driving signal is used to control an n-type transistor, and the gate driving unit according to at least one embodiment of the present disclosure may be applied to a Low Temperature Poly Oxide (LTPO) pixel circuit.

In the gate driving unit according to at least one embodiment of the present disclosure, the first output sub-circuit 121 controls the second gate driving signal output end OUT_N and the first clock signal end to communicate with each other at the potential of the first node N1, and since the potential of the first node N1 is bootstrapped low in the output period, the transistor included in the first output sub-circuit 121 can be fully turned on without a threshold voltage loss, so that the second gate driving signal output by OUT_N drops without a step, and the first output sub-circuit 121 is electrically connected to the first clock signal end, and the waveform of the first clock signal GCKO at the output level is the same as the waveform of the gate driving signal output by OUT_N.

In the related art, an LTPS (low temperature polysilicon) TFT (thin film transistor) device and an Oxide TFT device are integrated in an LTPO pixel, wherein the LTPS TFT device is a p-type transistor and the Oxide TFT device is an n-type transistor.

Optionally, the first output sub-circuit may include a first output transistor;

the control electrode of the first output transistor is electrically connected to the first node, the first electrode of the first output transistor is electrically connected to the first clock signal end, and the second electrode of the first output transistor is electrically connected to the second gate driving signal output end.

In at least one embodiment of the present disclosure, the first output transistor may be a p-type transistor, but is not limited thereto.

Figure 2:
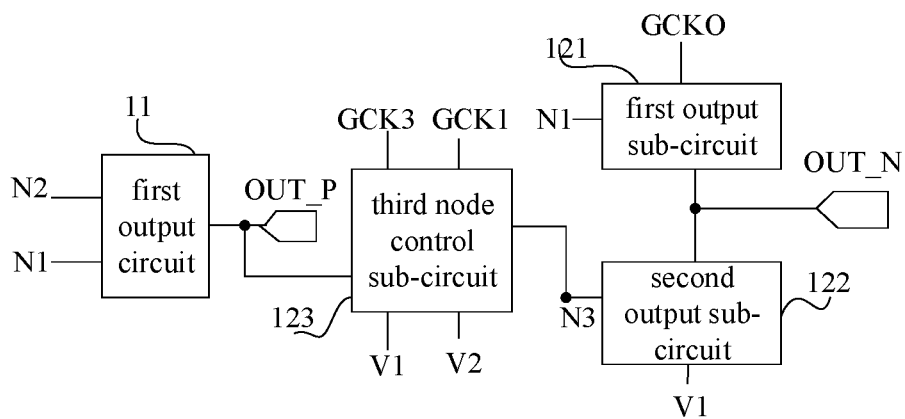
FIG. 2 is a structural diagram of a gate driving unit according to at least one embodiment of the disclosure.

As shown in FIG. 2, on the basis of at least one embodiment of the gate driving unit shown in FIG. 1, the second output circuit further includes a second output sub-circuit 122 and a third node control sub-circuit 123;

the second output sub-circuit 122 is electrically connected to a third node N3, the second gate driving signal output end OUT_N and the first voltage end V1, respectively, and is configured to control a writing of the first voltage signal provided by the first voltage end V1 into the second gate driving signal output end OUT_N under the control of the potential of the third node N3;

the third node control sub-circuit 123 is electrically connected to the first gate driving signal output end OUT_P, the second clock signal end, the third clock signal end, the first voltage end V1, and the second voltage end V2, and is configured to control a potential of the third node N3 under control of the first gate driving signal output by the first gate driving signal output end OUT_P, the second clock signal GCK3 provided by the second clock signal end, and the third clock signal GCK1 provided by the third clock signal end.

In at least one embodiment of the present disclosure, the first voltage end V1 can be a low voltage end, and the second voltage end V2 can be a high voltage end, but not limited thereto.

In operation of at least one embodiment of the gate driving unit shown in FIG. 2, the second output sub-circuit 122 controls OUT_N to output a first voltage signal under the control of the potential of the third node N3; the third node control sub-circuit 123 controls the potential of N3 under the control of the first gate driving signal, the second clock signal GCK3, and the third clock signal GCK 1.

Optionally, the second output sub-circuit includes a second output transistor;

the control electrode of the second output transistor is electrically connected to the third node, the first electrode of the second output transistor is electrically connected to the second gate driving signal output end, and the second electrode of the second output transistor is electrically connected to the first voltage end.

In at least one embodiment of the present disclosure, the third node control sub-circuit 123 is further configured to control a writing of the second voltage signal into the third node N3 under the control of the first gate driving signal, control a writing of the first voltage signal into the third node N3 under the control of the second clock signal GCK3, and control a potential of the third node N3 according to the third clock signal GCK 1.

Optionally, the third node control sub-circuit includes a first control transistor, a second control transistor and a first control capacitor, where a control electrode of the first control transistor is electrically connected to the first gate driving signal output end, a first electrode of the first control transistor is electrically connected to the second voltage end, and a second electrode of the first control transistor is electrically connected to the third node;

a control electrode of the second control transistor is electrically connected to the second clock signal end, a first electrode of the second control transistor is electrically connected to the third node, and a second electrode of the second control transistor is electrically connected to the first voltage end;

the first end of the first control capacitor is electrically connected to the third node, and the second end of the first control capacitor is electrically connected to the third clock signal end.

Figure 3A:
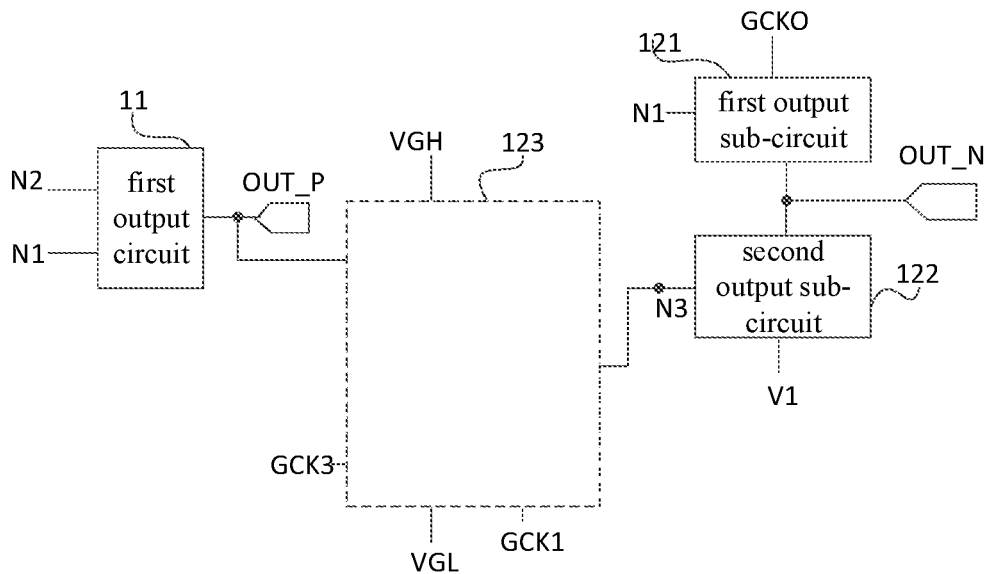
FIG. 3A is a structural diagram of a gate driving unit according to at least one embodiment of the disclosure.

As shown in FIG. 3A, on the basis of at least one embodiment of the gate driving unit shown in FIG. 2, the third node control sub-circuit 123 may include a first control transistor M11, a second control transistor M12, and a first control capacitor C3, where the gate of the first control transistor M11 is electrically connected to the first gate driving signal output end OUT_P, the source of the first control transistor M11 is electrically connected to a high voltage end, and the drain of the first control transistor M11 is electrically connected to the third node N3;

the gate of the second control transistor M12 is electrically connected to the second clock signal end, the source of the second control transistor M12 is electrically connected to the third node N3, and the drain of the second control transistor M12 is electrically connected to the low voltage end; the second clock signal end is used for providing a second clock signal GCK 3;

a first end of the first control capacitor C3 is electrically connected to the third node N3, and a second end of the first control capacitor C3 is electrically connected to the third clock signal end; the third clock signal end is used for providing a third clock signal GCK 1.

In at least one embodiment shown in FIG. 3A, M11 and M12 are p-type TFTs, but not limited thereto.

When at least one embodiment of the gate driving unit shown in FIG. 3A of the present disclosure is in operation, M11 is turned on when OUT_P outputs a low voltage signal, and M11 is turned off when OUT_P outputs a high voltage signal; when GCK3 is at low voltage, M12 turns on, and when GCK3 is at high voltage, M12 turns off; c3 is used to control the potential of N3 according to the potential of GCK 1.

In operation of at least one embodiment of the gate driving unit of the present disclosure as shown in FIG. 3A, when GCK3 is at low voltage, M12 is turned on, VGL is written into N3, and when GCK1 is at high voltage, C3 stores a negative voltage;

when the GCK1 is lowered from a high voltage to a low voltage, the potential of N3 is further lowered so that the second output transistor included in the second output sub-circuit can be fully turned on.

Figure 3B:
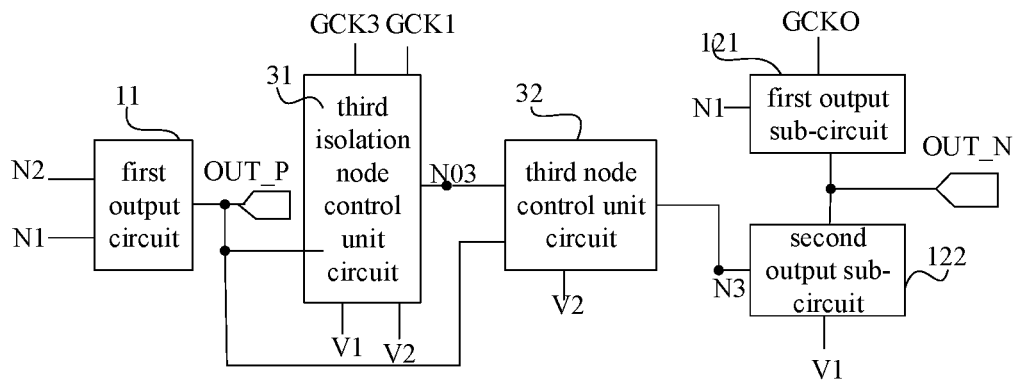
FIG. 3B is a structural diagram of a gate driving unit according to at least one embodiment of the disclosure.

As shown in FIG. 3B, on the basis of at least one embodiment of the gate driving unit shown in FIG. 2, the third node control sub-circuit may include a third isolation node control unit circuit 31 and a third node control unit circuit 32, where the third isolation node control unit circuit 31 is electrically connected to the first gate driving signal output end OUT_P, the second voltage end V2, a third isolation node N03, the second clock signal end, the third clock signal end and the first voltage end V1, respectively, and is configured to control the writing of the second voltage signal into the third isolation node N03 under the control of the first gate driving signal provided by OUT_P, control the writing of the first voltage signal into the third isolation node N03 under the control of the second clock signal GCK3, and control the potential of the third isolation node N03 according to the third clock signal GCK 1;

the third node control unit circuit 32 is electrically connected to the first gate driving signal output end OUT_P, the third isolation node N03, the second voltage end V2, and the third node N3, respectively, and is configured to write a second voltage signal into the third node N3 under the control of the first gate driving signal, and to control communication between the third node N3 and the third isolation node N03 under the control of a potential of the third isolation node N03, and to maintain the potential of the third node N3.

Optionally, the third isolation node control unit circuit includes a first control transistor, a second control transistor and a first control capacitor, where a control electrode of the first control transistor is electrically connected to the first gate driving signal output end, a first electrode of the first control transistor is electrically connected to the second voltage end, and a second electrode of the first control transistor is electrically connected to the third isolation node;

a control electrode of the second control transistor is electrically connected to the second clock signal end, a first electrode of the second control transistor is electrically connected to the third isolation node, and a second electrode of the second control transistor is electrically connected to the first voltage end;

the first end of the first control capacitor is electrically connected to the third isolation node, and the second end of the first control capacitor is electrically connected to the third clock signal end.

In at least one embodiment of the present disclosure, the third node control unit circuit may include a third control transistor, a fourth control transistor, and a first storage capacitor, where a control electrode of the third control transistor is electrically connected to the first gate driving signal end, a first electrode of the third control transistor is electrically connected to the second voltage end, and a second electrode of the third control transistor is electrically connected to the third node;

a control electrode of the fourth control transistor and a first electrode of the fourth control transistor are both electrically connected to the third isolation node, and a second electrode of the fourth control transistor is electrically connected to the third node;

the first end of the first storage capacitor is electrically connected to the third node, and the second end of the first storage capacitor is electrically connected to the first voltage end.

Figure 4:
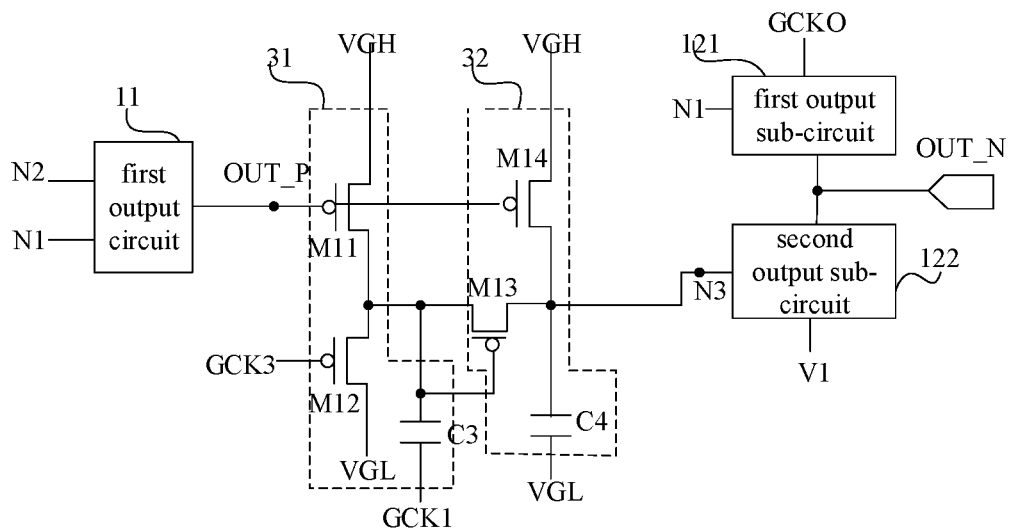
FIG. 4 is a structural diagram of a gate driving unit according to at least one embodiment of the disclosure.

As shown in FIG. 4, on the basis of at least one embodiment of the gate driving unit shown in FIG. 3B, the third isolation node control unit circuit 31 includes a first control transistor M11, a second control transistor M12, and a first control capacitor C3, where The gate of the first control transistor M11 is electrically connected to the first gate driving signal output end OUT_P, the source of the first control transistor M11 is electrically connected to the high voltage end, and the drain of the first control transistor M11 is electrically connected to the third isolation node N03; the high voltage end is used for providing a high voltage VGH;

the gate of the second control transistor M12 is electrically connected to the second clock signal end, the source of the second control transistor M12 is electrically connected to the third isolation node N03, and the drain of the second control transistor M12 is electrically connected to the low voltage end; the low voltage end is used for providing a low voltage VGL; the second clock signal end is used for providing a second clock signal GCK 3;

a first end of the first control capacitor C3 is electrically connected to the third isolation node N03, and a second end of the first control capacitor C3 is electrically connected to the third clock signal end; the third clock signal end is used for providing a third clock signal GCK1;

the third node control unit circuit 32 includes a third control transistor M14, a fourth control transistor M13, and a first storage capacitor C4, where a gate of the third control transistor M14 is electrically connected to the first gate driving signal end OUT_P, a source of the third control transistor M14 is electrically connected to a high voltage end, and a drain of the third control transistor M14 is electrically connected to the third node N3;

the gate of the fourth control transistor M13 and the source of the fourth control transistor M13 are both electrically connected to the third isolation node N03, and the drain of the fourth control transistor M13 is electrically connected to the third node N3;

a first end of the first storage capacitor C4 is electrically connected to the third node N3, and a second end of the first storage capacitor C3 is electrically connected to a low-voltage end;

the high voltage end is used for providing a high voltage VGH, and the low voltage end is used for providing a low voltage VGL.

In at least one embodiment shown in FIG. 4, all the transistors are p-type thin film transistors, but not limited thereto.

In operation of at least one embodiment of the gate driving unit of the present disclosure as shown in FIG. 4, when GCK3 is at low voltage, M12 is turned on, VGL is written into N03, and when GCK1 is at high voltage, C3 stores a negative voltage;

when the GCK1 is lowered from a high voltage to a low voltage, the potential of N3 is further lowered, M13 is turned on, and the potential of N3 is pulled low enough to enable the second output transistor included in the second output sub-circuit to be fully turned on.

In at least one embodiment of the gate driving unit shown in FIG. 4 of the present disclosure, if M13 is not used, since the potential of GCK1 is continuously switched between the high voltage and the low voltage, the potential of N3 cannot always maintain a sufficiently low potential, and the second output transistor included in the second output sub-circuit cannot be sufficiently turned on, so that the low voltage output effect is not good;

in at least one embodiment of the gate driving unit shown in FIG. 4, M13 is used, so that when GCK1 raises the potential of N03, M13 is turned off, and the low-level of N3 can be maintained at a sufficiently low potential, thereby ensuring the effect of low-voltage output.

Figure 5:
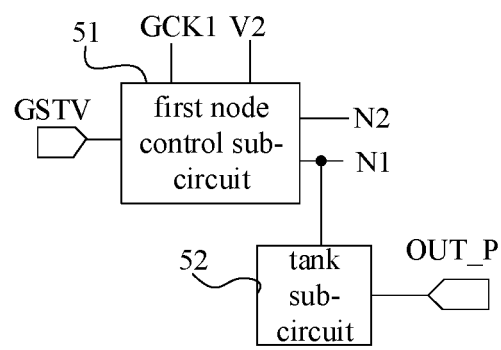
FIG. 5 is a block diagram of at least one embodiment of a first output circuit in a gate driving unit according to the present disclosure.

As shown in FIG. 5, the first output circuit may include a first node control sub-circuit 51 and a tank sub-circuit 52;

the first node control sub-circuit 51 is electrically connected to a third clock signal end, an input end GSTV, a second voltage end V2, a second node N2 and a first node N1, respectively, and is configured to write an input signal provided by the input end GSTV into the first node N1 under the control of a third clock signal GCK1 provided by the third clock signal end, and to write a second voltage signal provided by the second voltage end V2 into the first node N1 under the control of a potential of the second node N2;

a first end of the tank sub-circuit 52 is electrically connected to the first node N1, a second end of the tank sub-circuit 52 is electrically connected to the first gate-driving signal output end OUT_P, and the tank sub-circuit 52 is configured to store electric energy.

Optionally, the first node control sub-circuit comprises a fifth control transistor and a sixth control transistor, where a control electrode of the fifth control transistor is electrically connected to the third clock signal end, a first electrode of the fifth control transistor is electrically connected to the input end, and a second electrode of the fifth control transistor is electrically connected to the first node;

a control electrode of the sixth control transistor is electrically connected to the second node, a first electrode of the sixth control transistor is electrically connected to the second voltage end, and a second electrode of the sixth control transistor is electrically connected to the first node;

the tank sub-circuit comprises a second storage capacitor;

the first end of the second storage capacitor is electrically connected to the first node, and the second end of the second storage capacitor is electrically connected to the first gate driving signal output end.

In at least one embodiment of the present disclosure, the first node control sub-circuit may include a first control unit circuit, a second control unit circuit, a third control unit circuit, a fourth control unit circuit, a fifth control unit circuit, and a sixth control unit circuit, where the first control unit circuit is respectively electrically connected to a third clock signal end, the input end and a fourth node and is configured to write the input signal into the fourth node under the control of the third clock signal;

the second control unit circuit is electrically connected to the third clock signal end, the fourth node and the first node respectively, and is configured to control the communication between the fourth node and the first node under the control of the third clock signal;

the third control unit circuit is electrically connected to the first gate driving signal output end, the fourth clock signal end and the fourth node, and is configured to write a fourth clock signal provided by the fourth clock signal end into the fourth node under the control of the first gate driving signal provided by the first gate driving signal output end;

the fourth control unit circuit is respectively electrically connected to the second node, the second voltage end and the fifth node, and is configured to write a second voltage signal provided by the second voltage end into the fifth node under the control of the potential of the second node;

the fifth control unit circuit is respectively electrically connected to the second node, the fifth node and the first node and is configured to control the communication between the fifth node and the first node under the control of the potential of the second node;

the sixth control unit circuit is electrically connected to the first node, the fifth node, and the first voltage end, respectively, and configured to write a first voltage signal provided by the first voltage end into the fifth node under control of a potential of the first node.

In a specific implementation, the first node control sub-circuit may include a first control unit circuit, a second control unit circuit, a third control unit circuit, a fourth control unit circuit, a fifth control unit circuit, and a sixth control unit circuit, where the first control unit circuit is configured to write the input signal into the fourth node under the control of the third clock signal, the fourth control unit circuit is configured to write the second voltage signal into the fifth node under the control of the potential of the second node, and the second control unit circuit, the third control unit circuit, the fifth control unit circuit, and the sixth control unit circuit are configured to prevent a leakage current.

Figure 6:
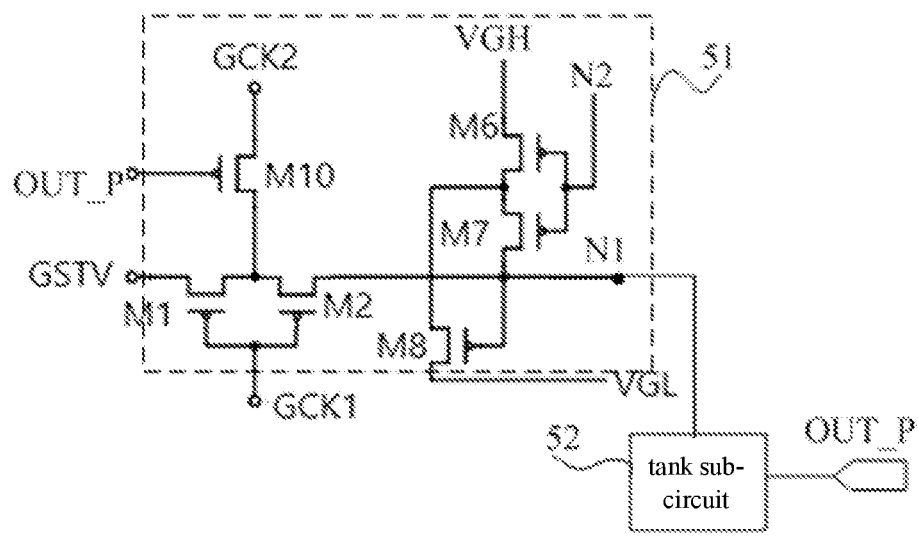
FIG. 6 is a block diagram of at least one embodiment of a first output circuit in a gate driving unit according to the present disclosure.

As shown in FIG. 6, on the basis of at least one embodiment of the gate driving unit shown in FIG. 5, the first node control sub-circuit 51 comprises a first control unit circuit, a second control unit circuit, a third control unit circuit, a fourth control unit circuit, a fifth control unit circuit and a sixth control unit circuit, where the first control unit circuit includes a fifth control transistor M1, the second control unit circuit includes a seventh control transistor M2, the third control unit circuit includes an eighth control transistor M10, the fourth control unit circuit includes a sixth control transistor M6, the fifth control unit circuit includes a ninth control transistor M7, the sixth control unit circuit includes a tenth control transistor M8, where a gate of M1 is electrically connected to the third clock signal end, a source of M1 is electrically connected to the input end GSTV, and a drain of M1 is electrically connected to a fourth node N4; the third clock signal end provides a third clock signal GCK1;

the gate of the M2 is electrically connected to the third clock signal end, the source of the M2 is electrically connected to the fourth node N4, and the drain of the M2 is electrically connected to the first node N1;

a gate of the M10 is electrically connected to the first gate driving signal output end OUT_P, a source of the M10 is electrically connected to the fourth clock signal end, and a drain of the M10 is electrically connected to the fourth node N4; the fourth clock signal end is used for providing a fourth clock signal GCK 2;

the gate of the M6 is electrically connected to the second node N2, the source of the M6 is electrically connected to the high-voltage end, and the drain of the M6 is electrically connected to the fifth node N5; the high voltage end is used for providing a high voltage VGH;

the gate of M7 is electrically connected to the second node N2, the source of M7 is electrically connected to the fifth node N5, and the drain of M7 is electrically connected to the first node N1;

the gate electrode of the M8 is electrically connected to the first node N1, the source electrode of the M8 is electrically connected to the fifth node N5, and the drain electrode of the M8 is electrically connected to a low-voltage end; the low voltage end is used for providing a low voltage VGL.

In at least one embodiment shown in FIG. 6, all the transistors are p-type thin film transistors, but not limited thereto.

In at least one embodiment shown in FIGS. 6, M1 and M2 constitute a double-gate transistor, M6 and M7 constitute a double-gate transistor, the leakage current of the double-gate transistor is small, and M10 is used to control the potential of N4, so that the drain-source voltage of M1 and the drain-source voltage of M2 are reduced in a predetermined time period, and the leakage current of M1 and the leakage current of M2 are reduced; and controlling the potential of N5 with M8 to reduce the drain-source voltage of M6 and the drain-source voltage of M7 for a predetermined period of time to reduce the leakage current of M6 and the leakage current of M7.

In at least one embodiment of the present disclosure, the first output circuit further includes a second node control sub-circuit and a third output sub-circuit;

the second node control sub-circuit is respectively electrically connected to a second node, the input end, a second clock signal end, a first voltage end and a second voltage end, and is configured to write a second voltage signal provided by the second voltage end into the second node under the control of the input signal, writing a first voltage signal provided by the first voltage end into the second node under the control of a second clock signal provided by the second clock signal end, and maintaining the potential of the second node;

the third output sub-circuit is respectively electrically connected to the second node, the second voltage end, the first gate driving signal output end, the first node and a fourth clock signal end, and is configured to write a fourth clock signal provided by the fourth clock signal end into the first gate driving signal output end under the control of the potential of the first node, and writing a second voltage signal into the first gate driving signal output end under the control of the potential of the second node.

Figure 7:
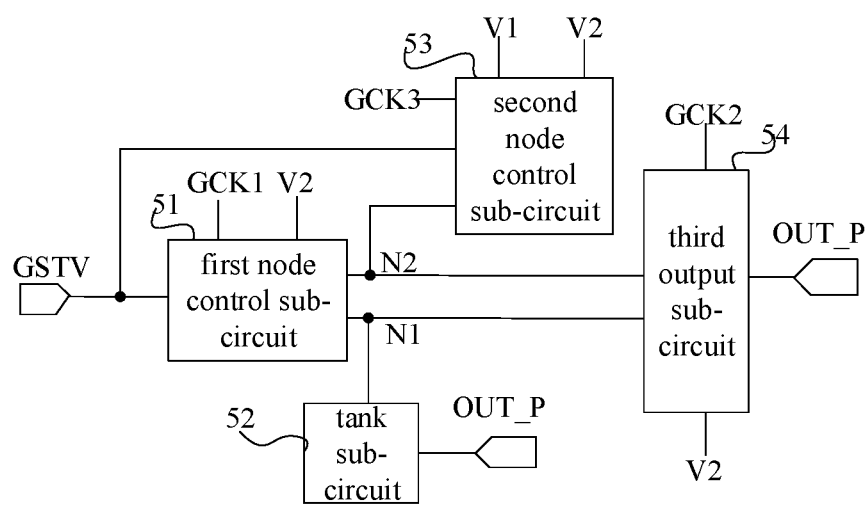
FIG. 7 is a block diagram of at least one embodiment of a first output circuit in a gate driving unit according to the present disclosure.

As shown in FIG. 7, on the basis of at least one embodiment of the gate driving unit shown in FIG. 5, the first output circuit further includes a second node control sub-circuit 53 and a third output sub-circuit 54;

the second node control sub-circuit 53 is electrically connected to the second node N2, the input end GSTV, the second clock signal end, the first voltage end V1, and the second voltage end V2, respectively, and is configured to write the second voltage signal provided by the second voltage end V2 into the second node N2 under the control of the input signal provided by GSTV, write the first voltage signal provided by the first voltage end V1 into the second node N2 under the control of the second clock signal GCK3 provided by the second clock signal end, and maintain the potential of the second node N2;

the third output sub-circuit 54 is electrically connected to the second node N2, the second voltage end V2, the first gate driving signal output end OUT_P, the first node N1, and the fourth clock signal end, and is configured to write the fourth clock signal GCK2 provided by the fourth clock signal end into the first gate driving signal output end OUT_P under the control of the potential of the first node N1, and write the second voltage signal into the first gate driving signal output end OUT_P under the control of the potential of the second node N2.

In operation of at least one embodiment of the gate driving unit shown in FIG. 7, the second node control sub-circuit 53 writes the second voltage signal into N2 under the control of the input signal, writes the first voltage signal into N2 under the control of the second clock signal GCK3, and maintains the potential of N2; the third output sub-circuit controls OUT_P to output GCK2 under the control of the potential of N1, and controls OUT_P to output a second voltage signal under the control of the potential of N2.

Optionally, the second node control sub-circuit includes a seventh control transistor, an eighth control transistor, and a second control capacitor;

a control electrode of the seventh control transistor is electrically connected to a second clock signal end, a first electrode of the seventh control transistor is electrically connected to a second node, and a second electrode of the seventh control transistor is electrically connected to the first voltage end;

a control electrode of the eighth control transistor is electrically connected to the input end, a first electrode of the eighth control transistor is electrically connected to the second voltage end, and a second electrode of the eighth control transistor is electrically connected to the second node;

the first end of the second control capacitor is electrically connected to the second node, and the second end of the second control capacitor is electrically connected to the second voltage end.

Optionally, the third output sub-circuit comprises a third output transistor and a fourth output transistor, where a control electrode of the third output transistor is electrically connected to the second node, a first electrode of the third output transistor is electrically connected to the second voltage end, and a second electrode of the third output transistor is electrically connected to the first gate driving signal output end;

a control electrode of the fourth output transistor is electrically connected to the first node, a first electrode of the fourth output transistor is electrically connected to the first gate driving signal output end, and a second electrode of the fourth output transistor is electrically connected to the fourth clock signal end.

Figure 8:
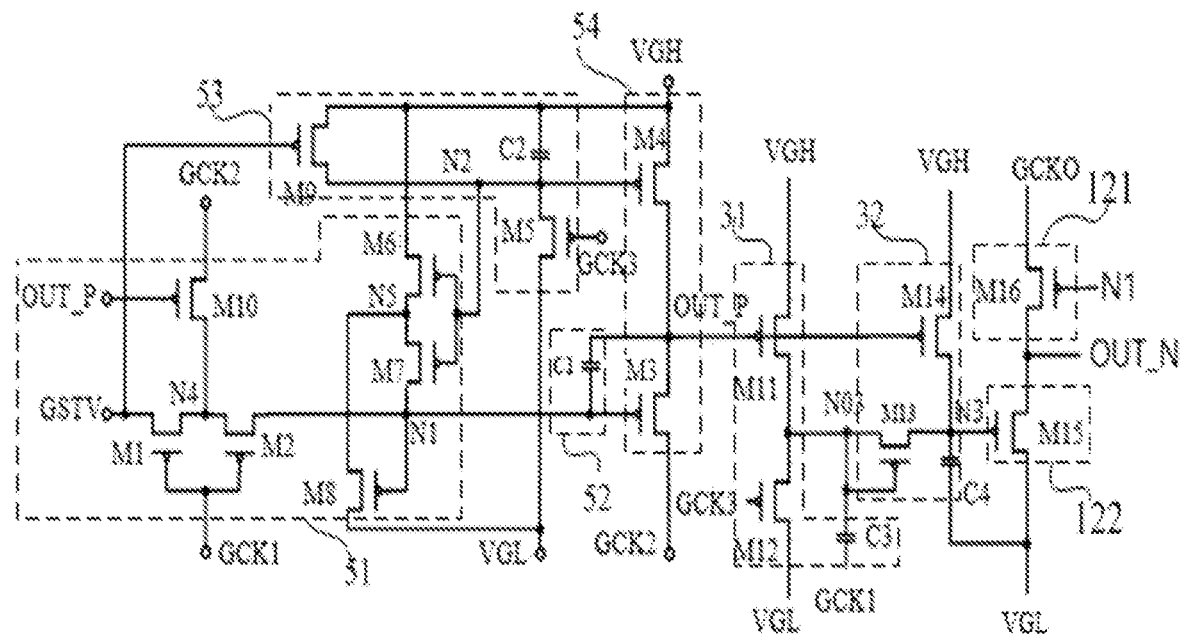
FIG. 8 is a circuit diagram of a gate driving unit according to at least one embodiment of the present disclosure.

As shown in FIG. 8, on the basis of at least one embodiment of the gate driving unit shown in FIG. 4, the first output sub-circuit 121 includes a first output transistor M16; the second output sub-circuit comprises a second output transistor M15; the first output circuit comprises a first node control sub-circuit 51, a tank sub-circuit 52, a second node control sub-circuit 53 and a third output sub-circuit 54;

a gate of M16 is electrically connected to the first node N1, a source of M16 is electrically connected to the first clock signal end, and a drain of M16 is electrically connected to the second gate driving signal output end OUT_N; the first clock signal end is used for providing a first clock signal GCKO;

the gate of the M15 is electrically connected to the third node N3, the source of the M15 is electrically connected to the second gate driving signal output end OUT_N, and the drain of the M15 is electrically connected to the low voltage end; the low voltage end is used for providing a low voltage VGL;

the first node control sub-circuit 51 includes a first control unit circuit, a second control unit circuit, a third control unit circuit, a fourth control unit circuit, a fifth control unit circuit, and a sixth control unit circuit, where the first control unit circuit includes a fifth control transistor M1, the second control unit circuit includes a seventh control transistor M2, the third control unit circuit includes an eighth control transistor M10, the fourth control unit circuit includes a sixth control transistor M6, the fifth control unit circuit includes a ninth control transistor M7, the sixth control unit circuit includes a tenth control transistor M8, where a gate of M1 is electrically connected to the third clock signal end, a source of M1 is electrically connected to the input end GSTV, and a drain of M1 is electrically connected to a fourth node N4; the third clock signal end provides a third clock signal GCK1;

the gate of the M2 is electrically connected to the third clock signal end, the source of the M2 is electrically connected to the fourth node N4, and the drain of the M2 is electrically connected to the first node N1;

a gate of the M10 is electrically connected to the first gate driving signal output end OUT_P, a source of the M10 is electrically connected to the fourth clock signal end, and a drain of the M10 is electrically connected to the fourth node N4; the fourth clock signal end is used for providing a fourth clock signal end GCK 2;

the gate of the M6 is electrically connected to the second node N2, the source of the M6 is electrically connected to the high-voltage end, and the drain of the M6 is electrically connected to the fifth node N5; the high voltage end is used for providing a high voltage VGH;

the gate of M7 is electrically connected to the second node N2, the source of M7 is electrically connected to the fifth node N5, and the drain of M7 is electrically connected to the first node N1;

the gate electrode of the M8 is electrically connected to the first node N1, the source electrode of the M8 is electrically connected to the fifth node N5, and the drain electrode of the M8 is electrically connected to a low-voltage end; the low voltage end is used for providing a low voltage VGL;

the tank sub-circuit 52 comprises a second storage capacitor C1;

a first end of C1 is electrically connected to the first node N1, a second end of C1 is electrically connected to OUT_P;

the second node control sub-circuit 53 includes a seventh control transistor M5, an eighth control transistor M9, and a second control capacitor C2;

the gate electrode of the M5 is electrically connected to a second clock signal end, the source electrode of the M5 is electrically connected to the second node N2, and the drain electrode of the M5 is electrically connected to a low-voltage end; the low voltage end is used for providing a low voltage VGL;

a gate of M9 is electrically connected to the input end GSTV, a source of

M9 is electrically connected to a high voltage end, and a drain of M9 is electrically connected to the second node N2; the high voltage end is used for providing a high voltage VGH;

a first end of the second control capacitor C2 is electrically connected to the second node N2, and a second end of the second control capacitor C2 is electrically connected to the high voltage end;

the third output sub-circuit 54 includes a third output transistor M4 and a fourth output transistor M3, where the gate of the third output transistor M4 is electrically connected to the second node N2, the source of the third output transistor M4 is electrically connected to the high voltage end, and the drain of the third output transistor M4 is electrically connected to the first gate driving signal output end OUT_P;

a gate of the fourth output transistor M3 is electrically connected to the first node N1, a source of the fourth output transistor M3 is electrically connected to the first gate driving signal output end OUT_P, and a drain of the fourth output transistor M3 is electrically connected to the fourth clock signal end; the fourth clock signal end is configured to provide a fourth clock signal GCK 2.

In at least one embodiment of the gate driving unit shown in FIG. 8, all the transistors are p-type thin film transistors, but not limited to this.

In at least one embodiment of the gate driving unit shown in FIG. 8, the size of M1 is the same as that of M2, and M1 and M2 are adjacent to each other on the layout, so the threshold voltage of M1 and the threshold voltage of M2 may be the same, but not limited thereto.

Figure 9:
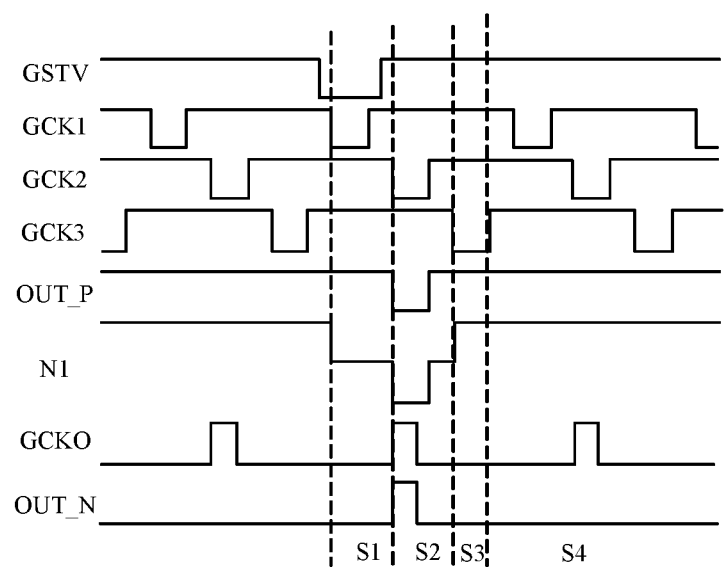
FIG. 9 is a timing diagram illustrating operation of at least one embodiment of the gate driving unit shown in FIG. 8 according to the present disclosure.

As shown in FIG. 9, when at least one embodiment of the gate driving unit of the present disclosure shown in FIG. 8 is in operation, in the pre-charge phase S1, GSTV provides a low voltage, GCK1 is a low voltage, GCK2 is a high voltage, M1 and M2 are turned on, the potential of N1 is pulled to a low potential VGL+Vth, M3 is turned on, OUT_P outputs a high voltage, and the voltage stored across C1 is VGL+Vth−VGH; meanwhile, M9 is turned on, the potential of N2 is high, and M4 is turned off; where $V^{th}$ is a threshold voltage of M1;

in the bootstrap output phase S2, GSTV provides high voltage, GCK1 is high voltage, GCK2 is low voltage, since M3 is turned on in the previous phase, the low voltage of GCK2 is transmitted to OUT_P through M3, meanwhile, since the voltage across C1 cannot suddenly change, the potential of N1 is raised to a lower potential, and the potential of N1 is 2VGL+Vth−2VGH, so that M3 is turned on better;

in the second half period included in the bootstrap output phase S2, GCK2 jumps from a low voltage to a high voltage because the potential of N1 is still lower than that of GCK2, so M3 is turned on, and OUTP outputs GCK2, thereby realizing a low pulse output of OUT_P;

in the bootstrap output phase S2, the low potential of N1 turns on M16, and OUT_N outputs GCKO, since the high pulse $wid^{th}$ of GCKO is smaller than that of GCK2, so that the pulse of GCKO can be fully transmitted to OUT_N, including the rising and falling portions; the low potential of the OUT_P turns on M11 and M14, stabilizes the potential of N3 and the potential of N03 at a high potential, and turns off M15, so that the logical conflict of the OUT_N output is avoided;

in the node pull-up level S3, GCK3 is low, M5 is turned on, the potential of N2 is pulled down to a low potential, M4 is turned on, and OUT_P outputs VGH; meanwhile, the low potential of N2 turns on M6 and M7, the potential of N1 is pulled high, M3 is turned off, M12 is turned on, the potential of N03 is low potential, and since GCK1 is high voltage, the storage potential of C3 is VGL+$V^{th}$12−VGH; where Vth12 is a threshold voltage of M12;

in the holding phase S4, GCK3 periodically pulls the potential of N2 to VGL to ensure that M4 is turned on, so that OUT_P stably outputs VGH, GCK3 periodically pulls the power of N03 and the potential of N3 low, stores VGL+Vth12−VGH in C3, and meanwhile, GCK1 periodically jumps to a low voltage to pull the potential of N03 and the potential of N3 to lower potentials through C3 to ensure that M15 is sufficiently turned on to output VGL to OUT_N.

As shown in FIG. 9, the duty cycle of GCK1, the duty cycle of GCK2, and the duty cycle of GCK3 may be the same; GCK2 is delayed for a predetermined time from GCK1, and GCK3 is delayed for a predetermined time from GCK2, so that GCK1, GCK2 and GCK3 are not low voltages at the same time, but the invention is not limited thereto.

In at least one embodiment of the present disclosure, the duty cycle of GCK1, the duty cycle of GCK2, and the duty cycle of GCK3 may be slightly less than ⅓, or the duty cycle of GCK1, the duty cycle of GCK2, and the duty cycle of GCK3 may also be equal to ⅓; but not limited thereto.

At least one embodiment of the present disclosure provides a gate driving circuit including the above gate driving unit.

The gate driving circuit according to at least one embodiment of the present disclosure further includes a first clock signal input end, a second clock signal input end, a third clock signal input end, a first clock signal end, a second first clock signal end, and a third first clock signal end;

the input end of the gate driving unit is electrically connected to the first gate driving signal output end of the adjacent upper-level gate driving unit;

a third clock signal end of the $(3n−2)^{th}$ level gate driving unit is electrically connected to the first clock signal input end, a fourth clock signal end of the $(3n−2)^{th}$ level gate driving unit is electrically connected to the second clock signal input end, and a second clock signal end of the $(3n−2)^{th}$ level gate driving unit is electrically connected to the third clock signal input end; the first clock signal end of the 3n−2 gate driving unit is electrically connected to the second first clock signal end;

a third clock signal end of the $(3n−1)^{th}$ level gate driving unit is electrically connected to a second clock signal input end, a fourth clock signal end of the $(3n−1)^{th}$ level gate driving unit is electrically connected to a third clock signal input end, and a second clock signal end of the $(3n−1)^{th}$ level gate driving unit is electrically connected to a first clock signal input end; the first clock signal end of the 3n−1 gate driving unit is electrically connected to the third first clock signal end;

a third clock signal end of the $3n^{th}$ level gate driving unit is electrically connected to a third clock signal input end, a fourth clock signal end of the $3n^{th}$ level gate driving unit is electrically connected to the first clock signal input end, and a second clock signal end of the $3n^{th}$ level gate driving unit is electrically connected to the second clock signal input end; the first clock signal end of the $3n^{th}$ gate driving unit is electrically connected to the first clock signal end;

n is a positive integer.

Figure 10:
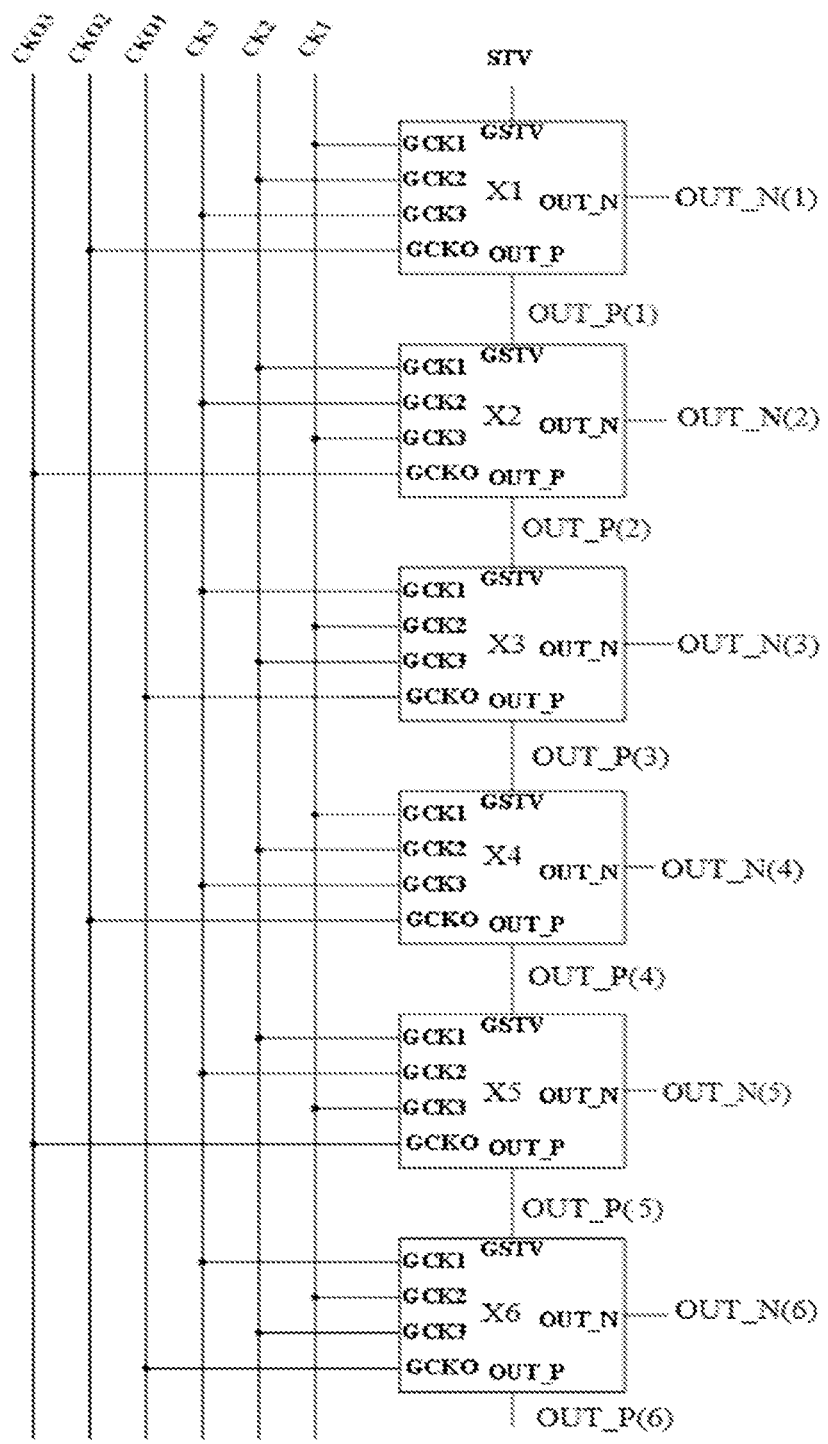
FIG. 10 is a block diagram of a gate driving circuit according to at least one embodiment of the disclosure.

As shown in FIG. 10, X1 is a first level gate driving unit of the gate driving circuit, X2 is a second level gate driving unit of the gate driving circuit, X3 is a third level gate driving unit of the gate driving circuit, X4 is a fourth level gate driving unit of the gate driving circuit, X5 is a fifth level gate driving unit of the gate driving circuit, and X6 is a sixth level gate driving unit of the gate driving circuit;

the reference number STV is the starting end; OUT_P (1) is a first gate driving signal output end of X1, OUT_N (1) is a second gate driving signal output end of X1; OUT_P (2) is a first gate driving signal output end of X2, OUT_N (2) is a second gate driving signal output end of X2; OUT_P (3) is a first gate driving signal output end of X3, and OUT_N (3) is a second gate driving signal output end of X3; OUT_P (4) is a first gate driving signal output end of X4, OUT_N (4) is a second gate driving signal output end of X4; OUT_P (5) is a first gate driving signal output end of X5, and OUT_N (5) is a second gate driving signal output end of X5; OUT_P (6) is a first gate driving signal output end of X6, and OUT_N (6) is a second gate driving signal output end of X6;

CK1 is a first clock signal input end, CK2 is a second clock signal input end, and CK3 is a third clock signal input end;

CKO1 is a first clock end, CKO2 is a second first clock end, and CKO3 is a third first clock end;

the third clock signal end of X1 is electrically connected to CK1, the fourth clock signal end of X1 is electrically connected to CK2, the second clock signal end of X1 is electrically connected to CK3, and the first clock signal end of X1 is electrically connected to CKO 2;

the third clock signal end of X2 is electrically connected to CK2, the fourth clock signal end of X2 is electrically connected to CK3, the second clock signal end of X2 is electrically connected to CK1, and the first clock signal end of X1 is electrically connected to CKO 3;

the third clock signal end of X3 is electrically connected to CK3, the fourth clock signal end of X3 is electrically connected to CK1, the second clock signal end of X1 is electrically connected to CK2, and the first clock signal end of X1 is electrically connected to CKO 1;

the third clock signal end of X4 is electrically connected to CK1, the fourth clock signal end of X4 is electrically connected to CK2, the second clock signal end of X4 is electrically connected to CK3, and the first clock signal end of X4 is electrically connected to CKO 2;

the third clock signal end of X5 is electrically connected to CK2, the fourth clock signal end of X5 is electrically connected to CK3, the second clock signal end of X5 is electrically connected to CK1, and the first clock signal end of X5 is electrically connected to CKO 3;

the third clock signal end of X6 is electrically connected to CK3, the fourth clock signal end of X6 is electrically connected to CK1, the second clock signal end of X6 is electrically connected to CK2, and the first clock signal end of X6 is electrically connected to CKO 1.

Figure 11:
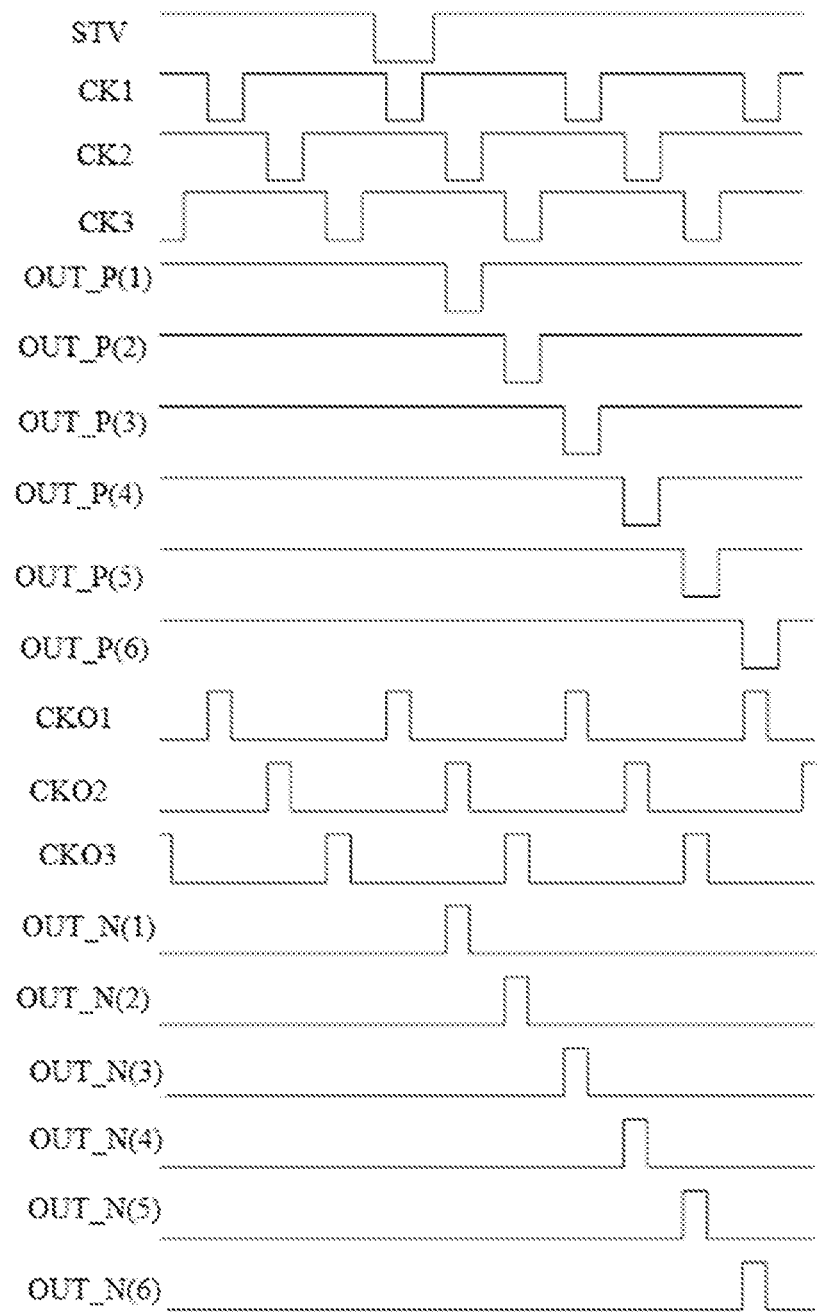
FIG. 11 is an operation timing diagram of a gate driving circuit according to at least one embodiment of the disclosure.

FIG. 11 is a timing diagram illustrating operation of at least one embodiment of the gate driving circuit of FIG. 10.

As shown in FIG. 11, the duty ratio of the clock signal supplied from CK1, the duty ratio of the clock signal supplied from CK2, and the duty ratio of the clock signal supplied from CK3 may be the same; the clock signal provided by CK2 is delayed by a predetermined time than the clock signal provided by CK1, and the clock signal provided by CK3 is delayed by a predetermined time than the clock signal provided by CK2, so that the clock signal provided by CK1, the clock signal provided by CK2 and the clock signal provided by CK3 are not at the same time a low voltage, but the invention is not limited thereto.

In at least one embodiment of the present disclosure, the duty ratio of the clock signal provided by CK1, the duty ratio of the clock signal provided by CK2, and the duty ratio of the clock signal provided by CK3 may be slightly smaller than ⅓, or the duty ratio of the clock signal provided by CK1, the duty ratio of the clock signal provided by CK2, and the duty ratio of the clock signal provided by CK3 may also be equal to ⅓; but not limited thereto.

As shown in FIG. 11, the duty cycle of the first clock signal provided by CKO1, the duty cycle of the second first clock signal provided by CKO2, and the duty cycle of the third first clock signal provided by CKO3 are all less than the duty cycle of the clock signal provided by CK1; and the first clock signal, the second first clock signal and the third first clock signal are not high voltages at the same time.

The gate driving method according to at least one embodiment of the present disclosure is applied to the gate driving circuit, and includes:

the first output circuit controls the first gate driving signal output end to output a first gate driving signal under the control of the potential of the first node and the potential of the second node;

the first output sub-circuit controls the communication between the second gate driving signal output end and the first clock signal end under the control of the potential of the first node.

At least one embodiment of the present disclosure provides a display device including the gate driving circuit.

The display device provided in at least one embodiment of the present disclosure may be any product or component having a display function, such as a mobile phone, a tablet computer, a television, a display, a notebook computer, a digital photo frame, and a navigator.

While the foregoing is directed to some embodiment of the present disclosure, it will be appreciated that various modifications and adaptations may be made by those skilled in the art without departing from the principles of the disclosure and should be considered as within the scope of the disclosure.

What is claimed is:

1. A gate driving unit, comprising
a first output circuit; and
a second output circuit,
wherein the second output circuit comprises a first output sub-circuit,
wherein the first output circuit is respectively electrically connected to a first node, a second node and a first gate driving signal output end, and is configured to control the first gate driving signal output end to output a first gate driving signal under a control of a potential of the first node and a potential of the second node,
wherein the first output sub-circuit is respectively electrically connected to the first node, a second gate driving signal output end and a first clock signal end, and is configured to control the second gate driving signal output end to be connected to the first clock signal end under the control of the potential of the first node,
wherein the second output circuit further comprises a second output sub-circuit and a third node control sub-circuit,
wherein the second output sub-circuit is respectively electrically connected to a third node, the second gate driving signal output end and a first voltage end, and is configured to control a writing of a first voltage signal provided by the first voltage end into the second gate driving signal output end under a control of a potential of the third node,
wherein the third node control sub-circuit is respectively electrically connected to the first gate driving signal output end, a second clock signal end, a third clock signal end, the first voltage end and a second voltage end, and is configured to control the potential of the third node under the control of the first gate driving signal output by the first gate driving signal output end, the second clock signal provided by the second clock signal end and the third clock signal provided by the third clock signal end,
wherein the third node control sub-circuit comprises a third isolation node control unit circuit and a third node control unit circuit, wherein the third isolation node control unit circuit is electrically connected to the first gate driving signal output end, the second voltage end, a third isolation node, the second clock signal end, the third clock signal end and the first voltage end, respectively, and is configured to control a writing of a second voltage signal into the third isolation node under a control of the first gate driving signal, control a writing of the first voltage signal into the third isolation node under a control of the second clock signal, and control a potential of the third isolation node according to the third clock signal, and wherein the third node control unit circuit is electrically connected to the first gate driving signal output end, the third isolation node, the second voltage end, and the third node, respectively, and is configured to write a second voltage signal into the third node under the control of the first gate driving signal, and is configured to control the third node and the third isolation node to be connected to each other under a control of a potential of the third isolation node, and is configured to maintain the potential of the third node.

2. The gate driving unit according to claim 1, wherein the first output sub-circuit comprises a first output transistor;
a control electrode of the first output transistor is electrically connected to the first node, a first electrode of the first output transistor is electrically connected to the first clock signal end, and a second electrode of the first output transistor is electrically connected to the second gate driving signal output end.

3. The gate driving unit according to claim 1, wherein the second output sub-circuit comprises a second output transistor;
a control electrode of the second output transistor is electrically connected to the third node, a first electrode of the second output transistor is electrically connected to the second gate driving signal output end, and a second electrode of the second output transistor is electrically connected to the first voltage end.

4. The gate driving unit according to claim 1, wherein the third node control sub-circuit is further configured to control a writing of a second voltage signal provided by the second voltage end into the third node under the control of the first gate driving signal, to control a writing of the first voltage signal into the third node under a control of the second clock signal, and to control a potential of the third node according to the third clock signal.

5. The gate driving unit according to claim 4, wherein the third node control sub-circuit comprises a first control transistor, a second control transistor, and a first control capacitor, wherein
a control electrode of the first control transistor is electrically connected to the first gate driving signal output end, a first electrode of the first control transistor is electrically connected to the second voltage end, and a second electrode of the first control transistor is electrically connected to the third node;
a control electrode of the second control transistor is electrically connected to the second clock signal end, a first electrode of the second control transistor is electrically connected to the third node, and a second electrode of the second control transistor is electrically connected to the first voltage end; and
a first end of the first control capacitor is electrically connected to the third node, and a second end of the first control capacitor is electrically connected to the third clock signal end.

6. The gate driving unit according to claim 1, wherein the third isolation node control unit circuit comprises a first control transistor, a second control transistor, and a first control capacitor, wherein
a control electrode of the first control transistor is electrically connected to the first gate driving signal output end, a first electrode of the first control transistor is electrically connected to the second voltage end, and a second electrode of the first control transistor is electrically connected to the third isolation node;
a control electrode of the second control transistor is electrically connected to the second clock signal end, a first electrode of the second control transistor is electrically connected to the third isolation node, and a second electrode of the second control transistor is electrically connected to the first voltage end; and
a first end of the first control capacitor is electrically connected to the third isolation node, and a second end of the first control capacitor is electrically connected to the third clock signal end.

7. The gate driving unit according to claim 1, wherein the third node control unit circuit comprises a third control transistor, a fourth control transistor, and a first storage capacitor, wherein
a control electrode of the third control transistor is electrically connected to the first gate driving signal end, a first electrode of the third control transistor is electrically connected to the second voltage end, and a second electrode of the third control transistor is electrically connected to the third node;
a control electrode of the fourth control transistor and a first electrode of the fourth control transistor are both electrically connected to the third isolation node, and a second electrode of the fourth control transistor is electrically connected to the third node; and
a first end of the first storage capacitor is electrically connected to the third node, and a second end of the first storage capacitor is electrically connected to the first voltage end.

8. The gate driving unit according to claim 1, wherein the first output circuit comprises a first node control sub-circuit and a tank sub-circuit;
the first node control sub-circuit is respectively electrically connected to a third clock signal end, an input end, a second voltage end, the second node and the first node, and is configured to write an input signal provided by the input end into the first node under a control of a third clock signal provided by the third clock signal end and write a second voltage signal provided by the second voltage end into the first node under the control of the potential of the second node;
the first end of the tank sub-circuit is electrically connected to the first node, the second end of the tank sub-circuit is electrically connected to the first gate driving signal output end, and the tank sub-circuit is configured to store electric energy.

9. The gate driving unit according to claim 8, wherein the first node control sub-circuit comprises a fifth control transistor and a sixth control transistor, wherein
a control electrode of the fifth control transistor is electrically connected to the third clock signal end, a first electrode of the fifth control transistor is electrically connected to the input end, and a second electrode of the fifth control transistor is electrically connected to the first node;
a control electrode of the sixth control transistor is electrically connected to the second node, a first electrode of the sixth control transistor is electrically connected to the second voltage end, and a second electrode of the sixth control transistor is electrically connected to the first node;

the tank sub-circuit comprises a second storage capacitor; a first end of the second storage capacitor is electrically connected to the first node, and a second end of the second storage capacitor is electrically connected to the first gate driving signal output end.

10. The gate driving unit according to claim 8, wherein the first node control sub-circuit comprises a first control unit circuit, a second control unit circuit, a third control unit circuit, a fourth control unit circuit, a fifth control unit circuit, and a sixth control unit circuit, wherein the first control unit circuit is respectively electrically connected to a third clock signal end, the input end and a fourth node and is configured to write the input signal into the fourth node under the control of the third clock signal;

the second control unit circuit is electrically connected to the third clock signal end, the fourth node and the first node respectively, and is configured to control a communication between the fourth node and the first node under the control of the third clock signal;

the third control unit circuit is electrically connected to the first gate driving signal output end, the fourth clock signal end and the fourth node, and is configured to write a fourth clock signal provided by the fourth clock signal end into the fourth node under the control of the first gate driving signal provided by the first gate driving signal output end;

the fourth control unit circuit is respectively electrically connected to the second node, the second voltage end and the fifth node, and is configured to write a second voltage signal provided by the second voltage end into the fifth node under the control of the potential of the second node;

the fifth control unit circuit is respectively electrically connected to the second node, the fifth node and the first node and is configured to control a communication between the fifth node and the first node under the control of the potential of the second node;

the sixth control unit circuit is electrically connected to the first node, the fifth node, and the first voltage end, respectively, and configured to write a first voltage signal provided by the first voltage end into the fifth node under the control of the potential of the first node.

11. The gate driving unit according to claim 10, wherein the first control unit circuit comprises a fifth control transistor, the second control unit circuit comprises a seventh control transistor, the third control unit circuit comprises an eighth control transistor, the fourth control unit circuit comprises a sixth control transistor, the fifth control unit circuit comprises a ninth control transistor, the sixth control unit circuit comprises a tenth control transistor, wherein a control electrode of the fifth control transistor is electrically connected to the third clock signal end, a first electrode of the fifth control transistor is electrically connected to the input end, and a second electrode of the fifth control transistor is electrically connected to the fourth node;

a control electrode of the seventh control transistor is electrically connected to the third clock signal end, a first electrode of the seventh control transistor is electrically connected to the fourth node, and a second electrode of the seventh control transistor is electrically connected to the first node;

a control electrode of the eighth control transistor is electrically connected to the first gate driving signal output end, a first electrode of the eighth control transistor is electrically connected to a fourth clock signal end, and a second electrode of the eighth control transistor is electrically connected to the fourth node;

a control electrode of the sixth control transistor is electrically connected to the second node, a first electrode of the sixth control transistor is electrically connected to the second voltage end, and a second electrode of the sixth control transistor is electrically connected to the fifth node;

a control electrode of the ninth control transistor is electrically connected to the second node, a first electrode of the ninth control transistor is electrically connected to the fifth node, and a second electrode of the ninth control transistor is electrically connected to the first node;

a control electrode of the tenth control transistor is electrically connected to the first node, a first electrode of the tenth control transistor is electrically connected to the fifth node, and a second electrode of the tenth control transistor is electrically connected to the first voltage end.

12. The gate driving unit according to claim 8, wherein the first output circuit further comprises a second node control sub-circuit and a third output sub-circuit;

the second node control sub-circuit is respectively electrically connected to a second node, the input end, a second clock signal end, a first voltage end and a second voltage end, and is configured to write a second voltage signal provided by the second voltage end into the second node under the control of the input signal, write a first voltage signal provided by the first voltage end into the second node under the control of a second clock signal provided by the second clock signal end, and maintain the potential of the second node;

the third output sub-circuit is respectively electrically connected to the second node, the second voltage end, the first gate driving signal output end, the first node and a fourth clock signal end, and is configured to write a fourth clock signal provided by the fourth clock signal end into the first gate driving signal output end under the control of the potential of the first node, and write a second voltage signal into the first gate driving signal output end under the control of the potential of the second node.

13. The gate driving unit according to claim 12, wherein the second node control sub-circuit comprises a seventh control transistor, an eighth control transistor, and a second control capacitance;

a control electrode of the seventh control transistor is electrically connected to a second clock signal end, a first electrode of the seventh control transistor is electrically connected to a second node, and a second electrode of the seventh control transistor is electrically connected to the first voltage end;

a control electrode of the eighth control transistor is electrically connected to the input end, a first electrode of the eighth control transistor is electrically connected to the second voltage end, and a second electrode of the eighth control transistor is electrically connected to the second node; and the first end of the second control capacitor is electrically connected to the second node, and the second end of the second control capacitor is electrically connected to the second voltage end.

14. The gate driving unit according to claim 12, wherein the third output sub-circuit comprises a third output transistor and a fourth output transistor, wherein

- a control electrode of the third output transistor is electrically connected to the second node, a first electrode of the third output transistor is electrically connected to the second voltage end, and a second electrode of the third output transistor is electrically connected to the first gate driving signal output end;
- a control electrode of the fourth output transistor is electrically connected to the first node, a first electrode of the fourth output transistor is electrically connected to the first gate driving signal output end, and a second electrode of the fourth output transistor is electrically connected to the fourth clock signal end.

15. A gate driving circuit comprising the gate driving unit according to claim 1.

16. The gate driving circuit according to claim 15, further comprising a first clock signal input end, a second clock signal input end, a third clock signal input end, a first clock signal end, a second first clock signal end, and a third first clock signal end;

- the input end of the gate driving unit is electrically connected to the first gate driving signal output end of the adjacent upper-level gate driving unit;
- a third clock signal end of a $(3n-2)^{th}$ level gate driving unit is electrically connected to the first clock signal input end, a fourth clock signal end of the $(3n-2)^{th}$ level gate driving unit is electrically connected to the second clock signal input end, and a second clock signal end of the $(3n-2)^{th}$ level gate driving unit is electrically connected to the third clock signal input end; the first clock signal end of the $(3n-2)^{th}$ gate driving unit is electrically connected to the second first clock signal end;
- a third clock signal end of the $(3n-1)^{th}$ level gate driving unit is electrically connected to a second clock signal input end, a fourth clock signal end of the $(3n-1)^{th}$ level gate driving unit is electrically connected to a third clock signal input end, and a second clock signal end of the $(3n-1)^{th}$ level gate driving unit is electrically connected to a first clock signal input end; the first clock signal end of the $(3n-1)^{th}$ gate driving unit is electrically connected to the third first clock signal end;
- a third clock signal end of the $3n^{th}$ level gate driving unit is electrically connected to a third clock signal input end, a fourth clock signal end of the $3n^{th}$ level gate driving unit is electrically connected to the first clock signal input end, and a second clock signal end of the $3n^{th}$ level gate driving unit is electrically connected to the second clock signal input end; the first clock signal end of the $3n^{th}$ gate driving unit is electrically connected to the first clock signal end;

n is a positive integer.

17. A display device comprising the gate driving circuit according to claim 15.

18. A gate driving method, applied to the gate driving circuit according to claim 1, comprising:

- the first output circuit controlling the first gate driving signal output end to output a first gate driving signal under the control of the potential of the first node and the potential of the second node;
- the first output sub-circuit controlling a communication between the second gate driving signal output end and the first clock signal end under the control of the potential of the first node.

* * * * *